(12) United States Patent
Hwang

(10) Patent No.: US 9,804,232 B2
(45) Date of Patent: Oct. 31, 2017

(54) PROTECTIVE SLEEVE STRUCTURE FOR PROXIMITY SENSOR

(71) Applicant: Yaw-Der Hwang, Taichung (TW)

(72) Inventor: Yaw-Der Hwang, Taichung (TW)

(*) Notice: Subject to any disclaimer, the term of this patent is extended or adjusted under 35 U.S.C. 154(b) by 269 days.

(21) Appl. No.: 14/796,742

(22) Filed: Jul. 10, 2015

(65) Prior Publication Data

US 2017/0010336 A1    Jan. 12, 2017

(51) Int. Cl.
G01D 11/24 (2006.01)
G01R 33/00 (2006.01)
G01V 3/08 (2006.01)

(52) U.S. Cl.
CPC .......... G01R 33/0047 (2013.01); G01V 3/08 (2013.01); G01D 11/245 (2013.01)

(58) Field of Classification Search
CPC ..... G01D 11/245; G01R 33/0047; G01V 3/08
See application file for complete search history.

(56) References Cited

U.S. PATENT DOCUMENTS

| 2,615,081 A | 10/1952 | Hoff |
| 4,394,190 A | 7/1983 | Ertl et al. |
| 5,093,617 A * | 3/1992 | Murata ............... C01B 17/905 123/146.5 A |
| 5,810,724 A * | 9/1998 | Gronvall ............ A61B 5/02427 600/310 |
| 5,877,626 A | 3/1999 | Umemoto et al. |
| 2010/0212433 A1 | 8/2010 | Hunziker et al. |
| 2012/0007702 A1 * | 1/2012 | Pearce ............... H01H 36/008 335/207 |

FOREIGN PATENT DOCUMENTS

| CN | 202074987 U | 12/2011 |
| CN | 202101679 U | 1/2012 |
| EP | 2477013 A1 | 7/2012 |
| FR | 2963683 A1 | 2/2012 |
| JP | S5853338 U | 4/1983 |
| JP | S58154543 U | 10/1983 |
| JP | 61169929 U | 10/1986 |
| JP | H09171750 A | 6/1997 |
| JP | H101088751 A | 7/1998 |
| JP | H11317139 A | 11/1999 |
| JP | 2007074519 A | 3/2007 |
| TW | M476031 | 4/2014 |

* cited by examiner

Primary Examiner — James Wu
(74) Attorney, Agent, or Firm — Alan D. Kamrath; Kamrath IP Lawfirm, P.A.

(57) ABSTRACT

A protective sleeve structure for a proximity sensor contains a body made of non-magnetic material, and the body includes a fitting portion arranged on a first end thereof to fit with a sensing end of the proximity sensor. An outer surface of the body is located at a non-sensing area of the proximity sensor. The body also includes a passageway defined on a second end thereof and located at a sensing area of the proximity sensor to pass an inducing element through the passageway, such that the inducing element triggers the proximity sensor. Accordingly, the protective sleeve structure stops metal substances attaching in the sensing area of the proximity sensor by using its body to avoid triggering the proximity sensor unintentionally. Preferably, the protective sleeve structure is simplified greatly and is manufactured easily.

6 Claims, 10 Drawing Sheets

PROTECTIVE SLEEVE STRUCTURE FOR PROXIMITY SENSOR

FIELD OF THE INVENTION

The present invention relates to a protective sleeve structure for a proximity sensor which stops metal substances attaching in a sensing area the proximity sensor to avoid triggering the proximity sensor unintentionally.

BACKGROUND OF THE INVENTION

A conventional proximity sensor is applicable for a variety of automated machines, semiconductor equipment or machine tools. The proximity sensor senses an inducing element in a non-contacting manner so that data of the inducing element or of the position information of an operating mechanism is obtained by a controller. Referring to FIG. 1, a conventional inductive proximity sensor 10 contains a LC and transistor circuit to produce vibration, such that a sensing area A of a sensing end 11 of the inductive proximity sensor 10 generates a high-frequency electromagnetic field. When a magnetic metal object (such as iron or nickel) approaches a plane on a front end of a coil, a magnetic vortex in the induction coil changes to transform the circuit, thus outputting voltage. Thereafter, the inducing element is sensed if it moves close to or away from the coil.

The inductive proximity sensor 10 senses the inducing element made of magnetic metal material by using electromagnetic effects. Because magnetic lines of the coil are influenced by adjacent objects, when a magnetic attracting object or another magnetic proximity sensor approaches the inductive proximity sensor 10, a sensing error occurs to trigger the inductive proximity sensor 10. Taking a machine tool for example, when the machine tool machines a metal workpiece, metal chips attach in the sensing area A of the sensing end 11 of the inductive proximity sensor 10 to cause a sensing error and to trigger the inductive proximity sensor 10 accidently.

The present invention has arisen to mitigate and/or obviate the afore-described disadvantages.

SUMMARY OF THE INVENTION

The primary objective of the present invention is to provide a protective sleeve structure for a proximity sensor which contains a body made of non-magnetic material. The body includes a fitting portion arranged on a first end thereof to fit with a sensing end of a proximity sensor, and an outer surface of the body is located at a non-sensing area of the proximity sensor. The body also includes a passageway defined on a second end thereof and located at a sensing area of the proximity sensor to pass an inducing element through the passageway to trigger the sensing end of the proximity sensor. Hence, the inducing element enters into the sensing area of the proximity sensor through the passageway of the body to trigger the proximity sensor, and the outer surface of the body stops metal substances attaching in the sensing area of the proximity sensor to avoid triggering the proximity sensor unintentionally.

Another objective of the present invention is to provide a protective sleeve structure for a proximity sensor which contains the body made of non-magnetic material. The body includes a fitting portion arranged on a first end thereof to fit with the sensing end of the proximity sensor, and the outer surface of the body is located at the non-sensing area of the proximity sensor. The body also includes the passageway defined on the second end thereof and located at the sensing area of the proximity sensor to pass the inducing element through the passageway to trigger the sensing end of the proximity sensor. Hence, the body of the protective sleeve structure is simplified and is connected with the sensing end of the proximity sensor easily.

BRIEF DESCRIPTION OF THE DRAWINGS

FIG. 5-1 is a cross sectional view showing the application of the protective sleeve structure for the proximity sensor according to the first embodiment of the present invention.

FIG. 5-2 is another cross sectional view showing the application of the protective sleeve structure for the proximity sensor according to the first embodiment of the present invention.

FIG. 5-3 is also another cross sectional view showing the application of the protective sleeve structure for the proximity sensor according to the first embodiment of the present invention.

FIG. 6-1 is a cross sectional view showing the application of the protective sleeve structure for the proximity sensor according to a second embodiment of the present invention.

FIG. 6-2 is another cross sectional view showing the application of the protective sleeve structure for the proximity sensor according to the second embodiment of the present invention.

FIG. 6-3 is also another cross sectional view showing the application of the protective sleeve structure for the proximity sensor according to the second embodiment of the present invention.

DETAILED DESCRIPTION OF THE PREFERRED EMBODIMENTS

Figure 2:
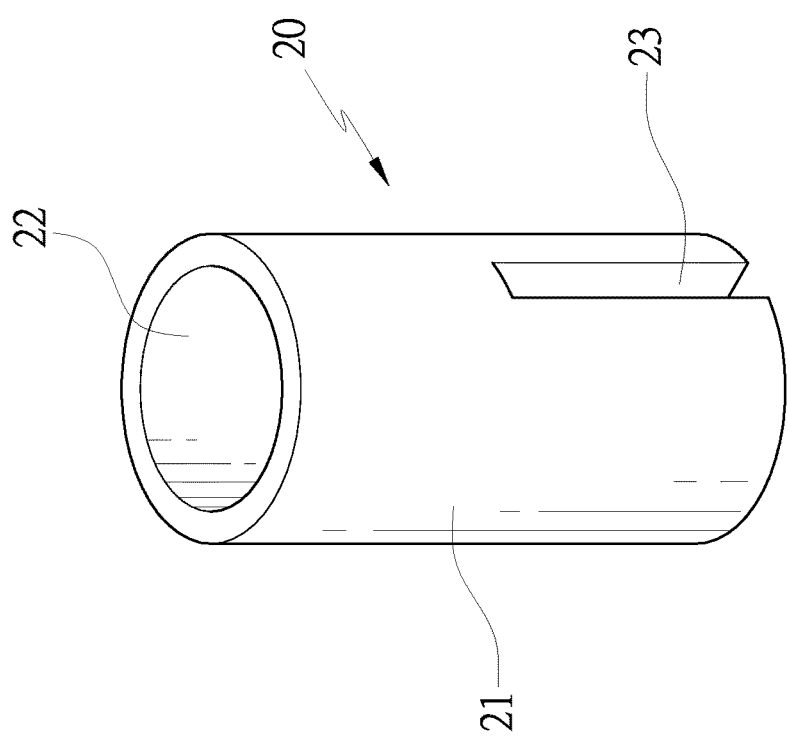
FIG. 2 is a perspective view showing the assembly of a body of a protective sleeve structure for a proximity sensor according to a first embodiment of the present invention.
Figure 3:
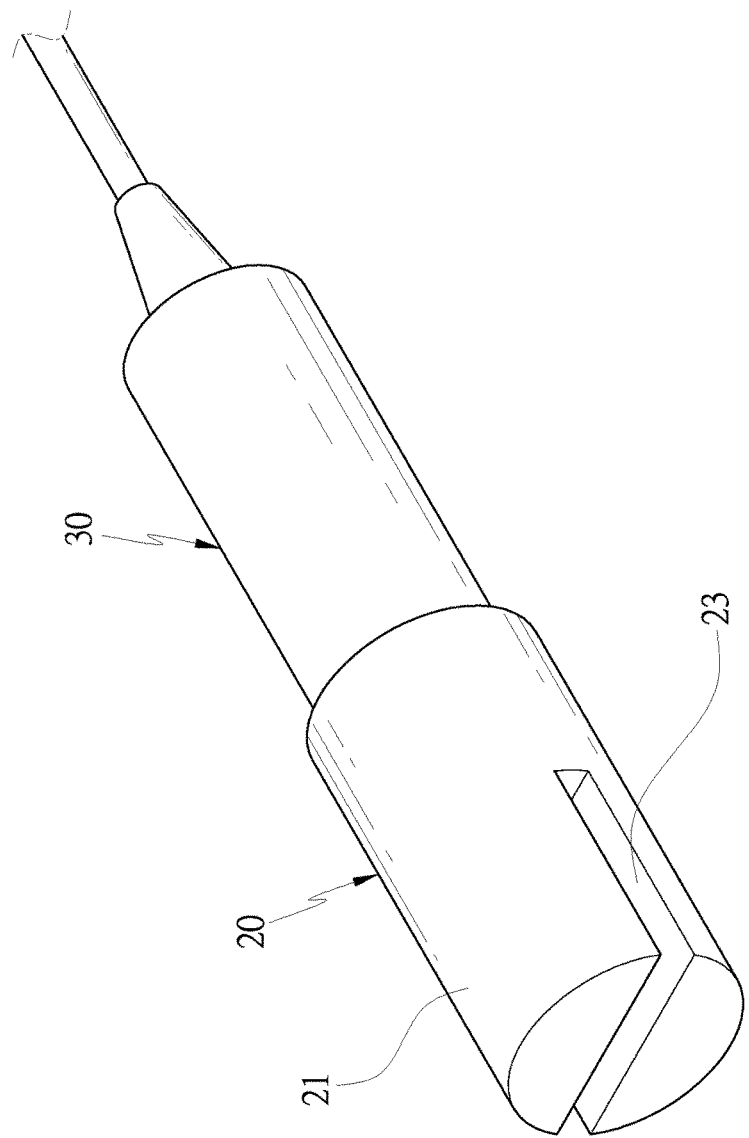
FIG. 3 is a perspective view showing the application of the protective sleeve structure for the proximity sensor according to the first embodiment of the present invention.
Figure 4:
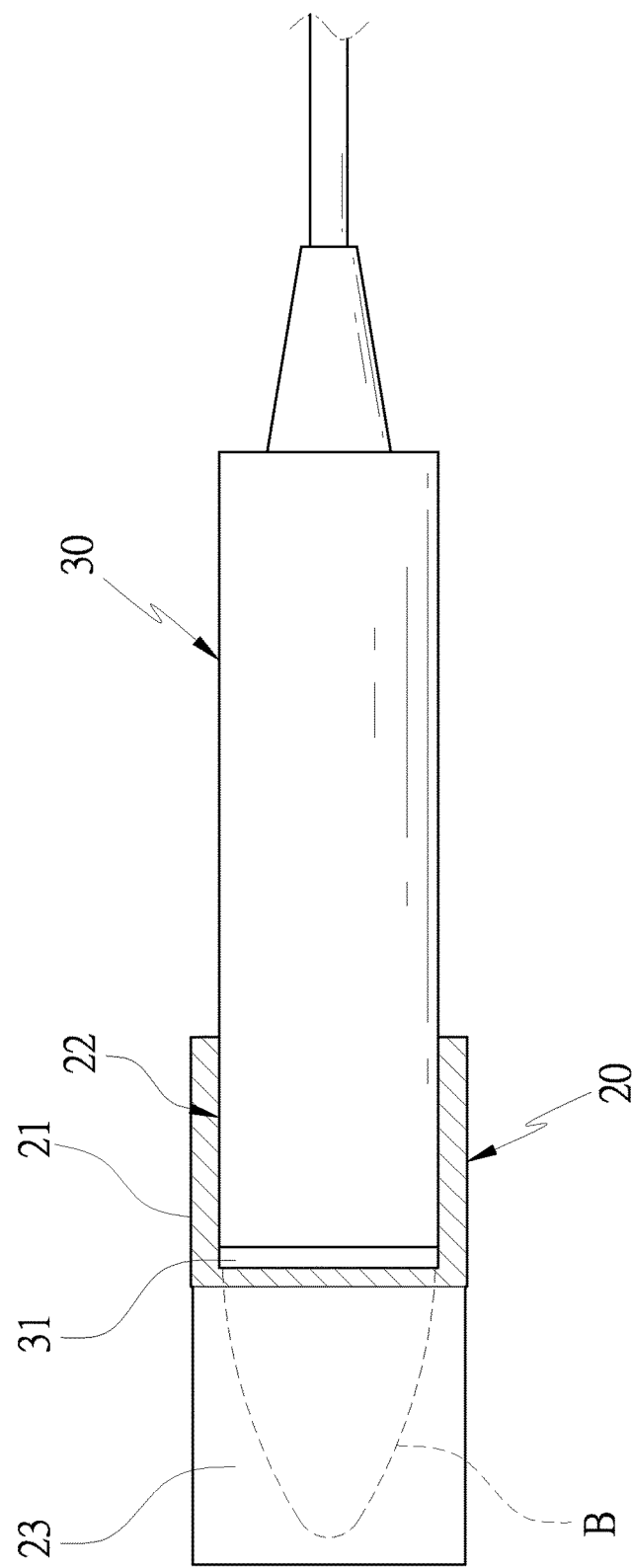
FIG. 4 is a cross sectional view showing the application of the protective sleeve structure for the proximity sensor according to the first embodiment of the present invention.

With reference to FIGS. 2 to 4, a protective sleeve structure for a proximity sensor according to a first embodiment of the present invention comprises a body 20 made of non-magnetic material. In this embodiment, the body 20 is injection molded from plastic material or rubber material. The body 20 includes a fitting portion 22 arranged on a first end thereof to fit with a sensing end 31 of a proximity sensor 30, and an outer surface 21 of the body 20 is located outside a sensing area B (i.e., non-sensing area) of the proximity sensor 30. In this embodiment, the fitting portion 22 is a recessed hole and its size matches with the sensing end 31 of the proximity sensor 30 to matingly fit with the sensing end 31 of the proximity sensor 30, and the body 20 is connected with the sensing end 31 of the proximity sensor 30 easily. The body 20 also includes a passageway 23 defined on a second end thereof and located at the sensing area B of the proximity sensor 30 to pass an inducing element through the passageway 23, such that the inducing element triggers the sensing end 31 of the proximity sensor 30. In this embodiment, the passageway 23 is formed in a slot shape, and its width cooperates with a size of the inducing element. A gap between the passageway 23 and the inducing element is minimized. Preferably, the body 20 is simplified greatly. After the body 20 is connected with the sensing end 31 of the proximity sensor 30, the passageway 23 is located at the sensing area B of the proximity sensor 30, and the outer surface 21 of the body 20 is located at non-sensing area of the proximity sensor 30, such that the protective sleeve structure stops metal substances attaching in the sensing area B of the proximity sensor 30 by using the outer surface 21 of the body 20 to avoid triggering the proximity sensor 30 unintentionally.

Figure 1:
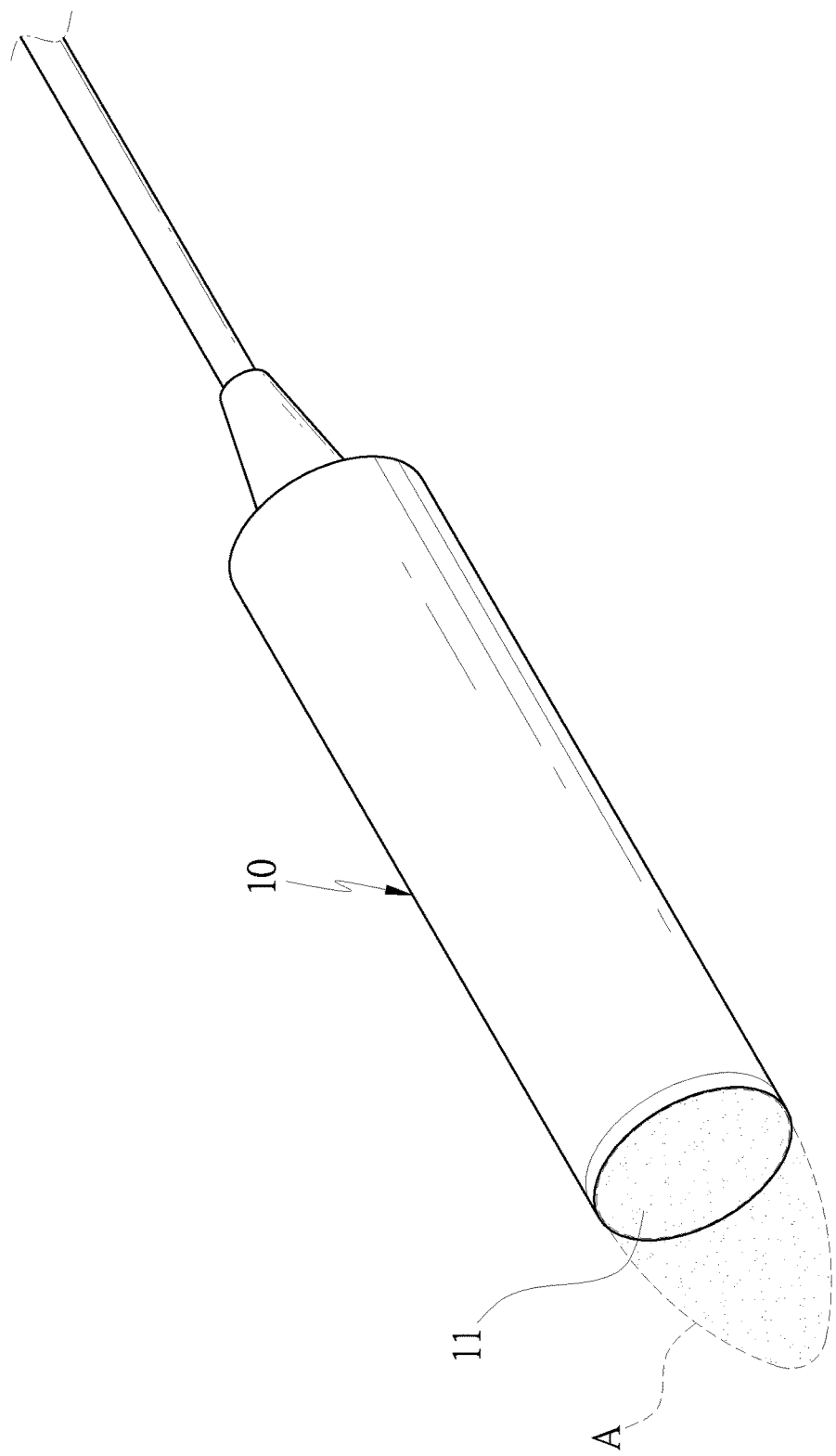
FIG. 1 is a perspective view of a conventional proximity sensor.
Figures 1, 5:
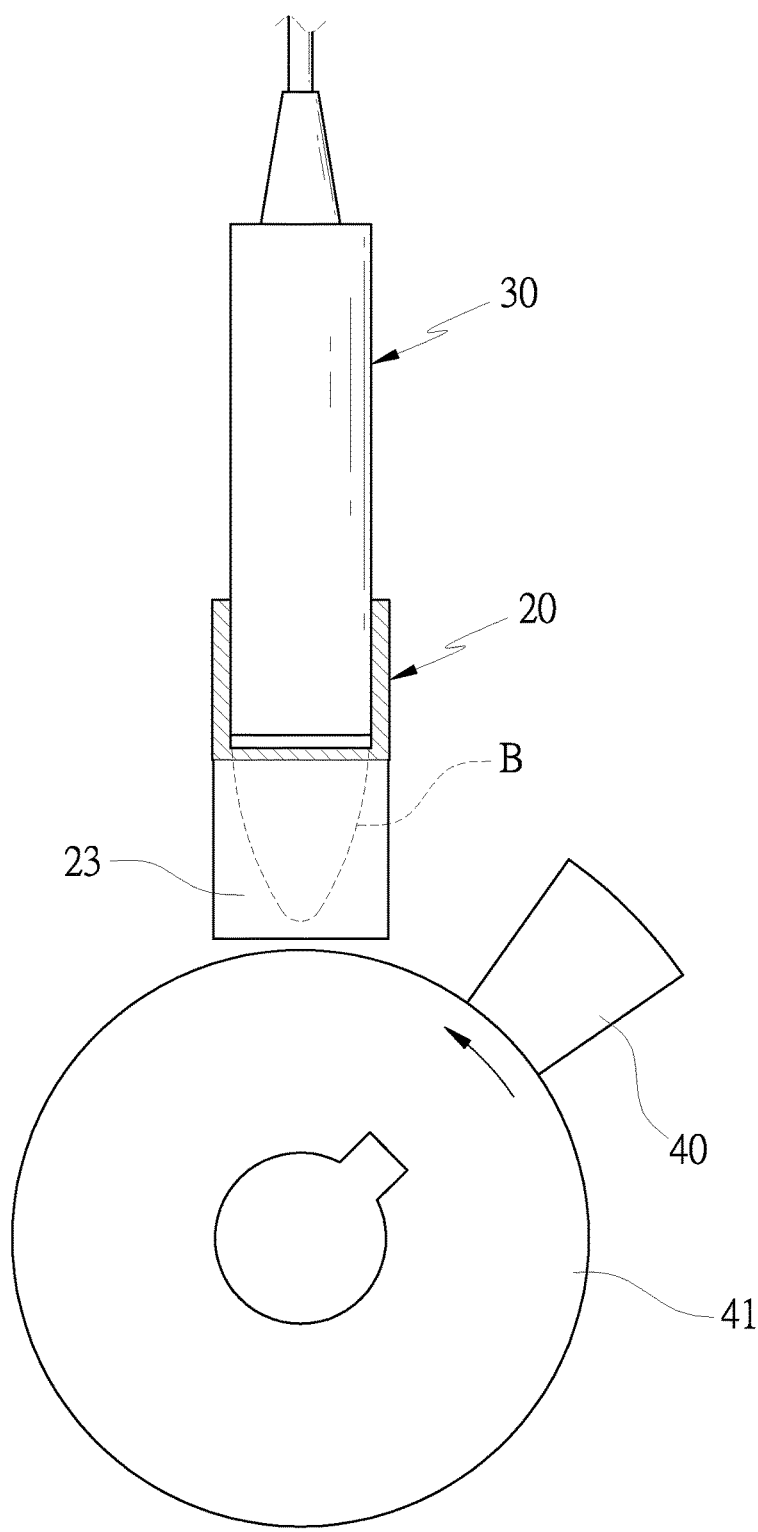
Figures 2, 5:
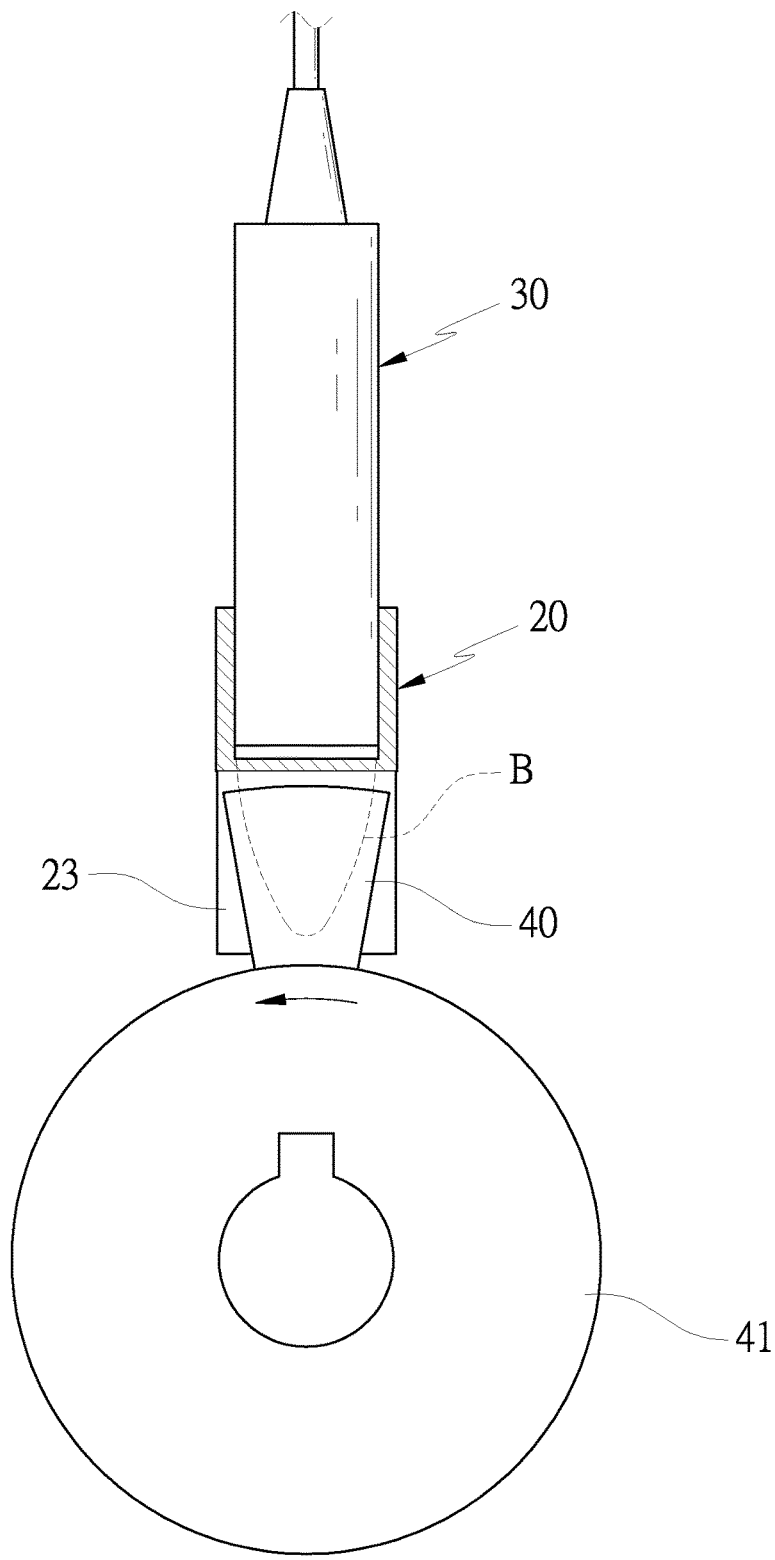
Figures 3, 5:
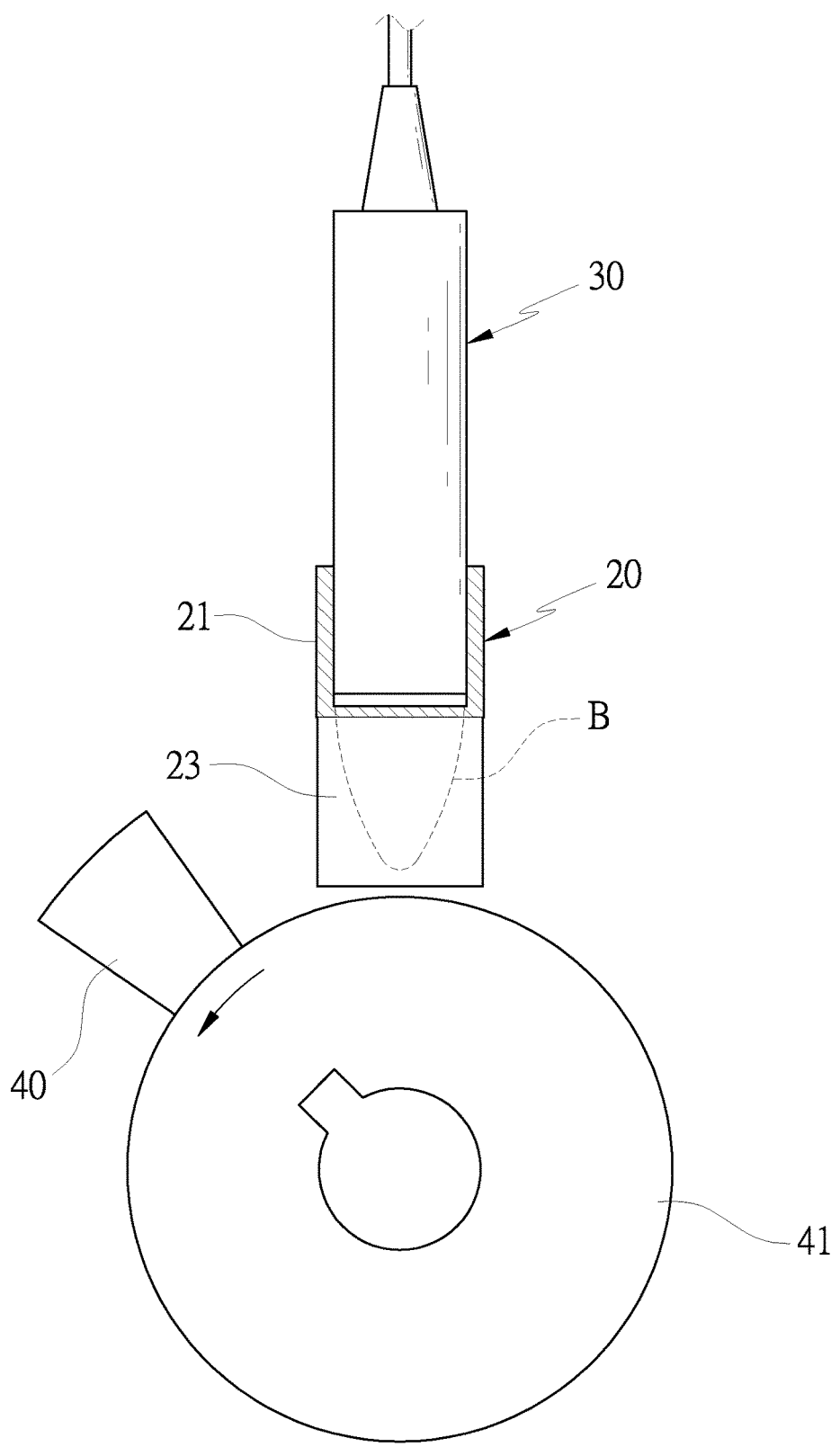

Referring to FIG. 5-1, the inducing element 40 is rotated into the sensing area B of the proximity sensor 30, and the inducing element 40 is made of magnetic metal material and is mounted on an outer peripheral side of a rotating wheel 41. Of course, the inducing element 40 is one piece formed with the rotating wheel 41, so that the inducing element 40 extends outwardly from the outer peripheral of the rotating wheel 41. When the rotating wheel 41 does not rotate, the inducing element 40 is not driven by the rotating wheel 41 to enter into the sensing area B of the proximity sensor 30, so that electromagnetic effects in the sensing area B are not changed by the inducing element 40, and so that the proximity sensor 30 is not triggered. As shown in FIG. 5-2, when the rotating wheel 41 rotates to drive the inducing element 40 to enter into the sensing area B of the proximity sensor 30 through the passageway 23 of the body 20, the inducing element 40 changes the electromagnetic effects in the sensing area B, and the proximity sensor 30 is triggered to transmit a sensing signal to a controller. As illustrated in FIG. 5-3, when the rotating wheel 41 rotates to drive the inducing element 40 to move away from the sensing area B of the proximity sensor 30 via the passageway 23 of the body 20, the electromagnetic effects in the sensing area B recover, and the proximity sensor 30 stops transmitting the sensing signal to the controller. Accordingly, the inducing element 40 enters into the sensing area B of the proximity sensor 30 through the passageway 23 of the body 20 to trigger the proximity sensor 30. Preferably, because the outer surface 21 of the body 20 is located at the non-sensing area of the proximity sensor 30, it protects the sensing area B of the proximity sensor 30 and stops the metal substances attaching in the sensing area B of the proximity sensor 30 to avoid triggering the proximity sensor 30 unintentionally.

Figures 1, 6:
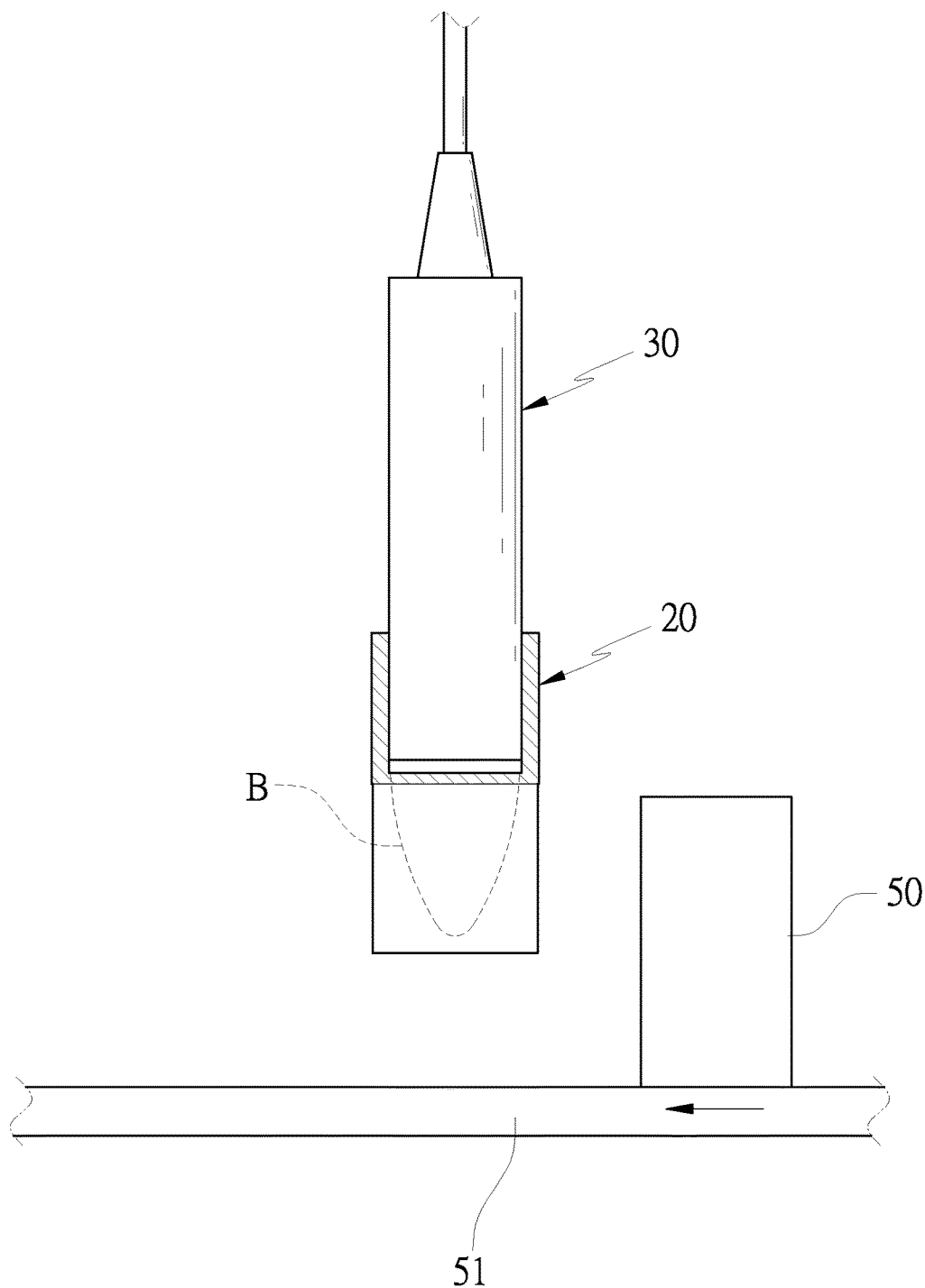
Figures 2, 6:
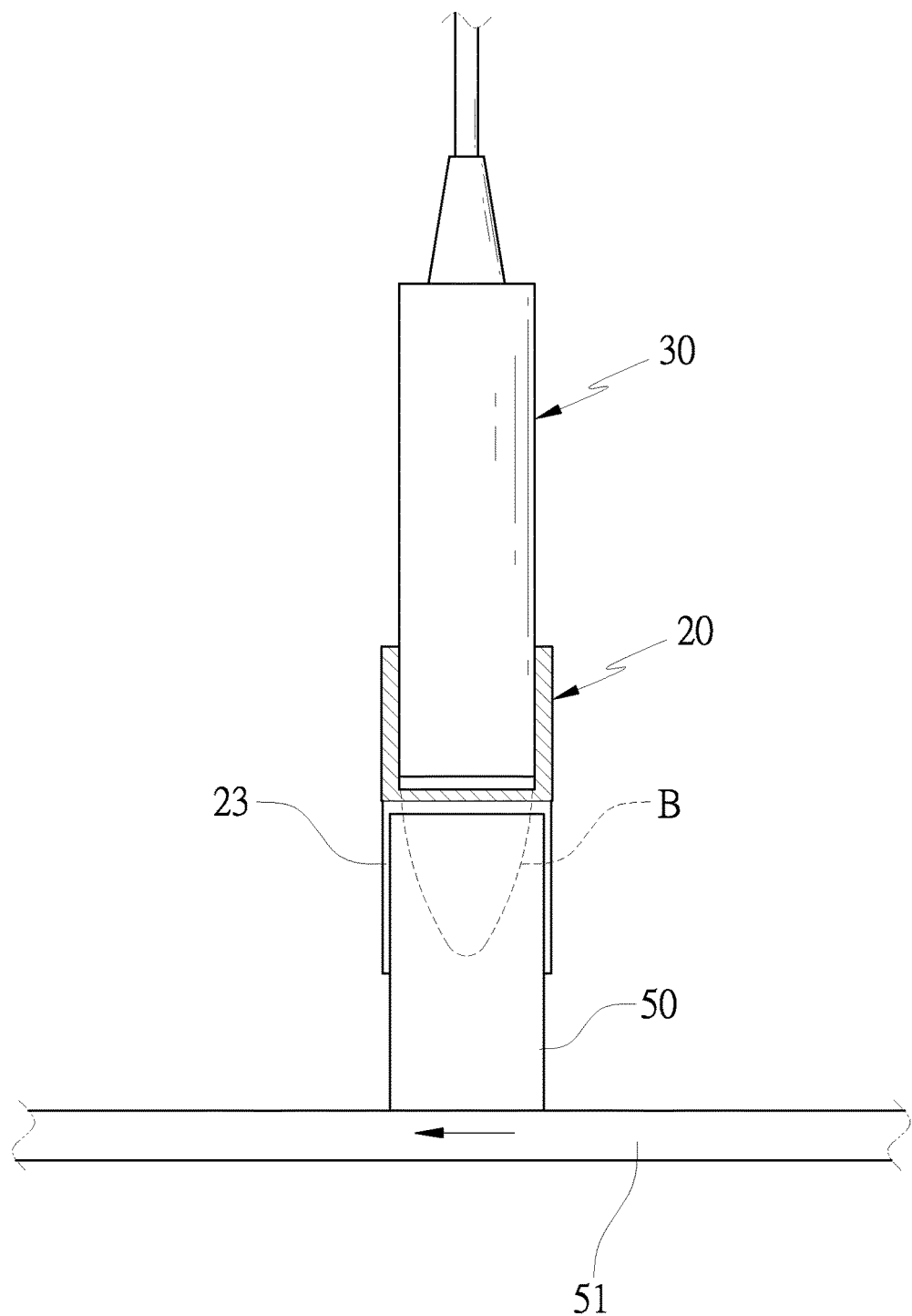
Figures 3, 6:
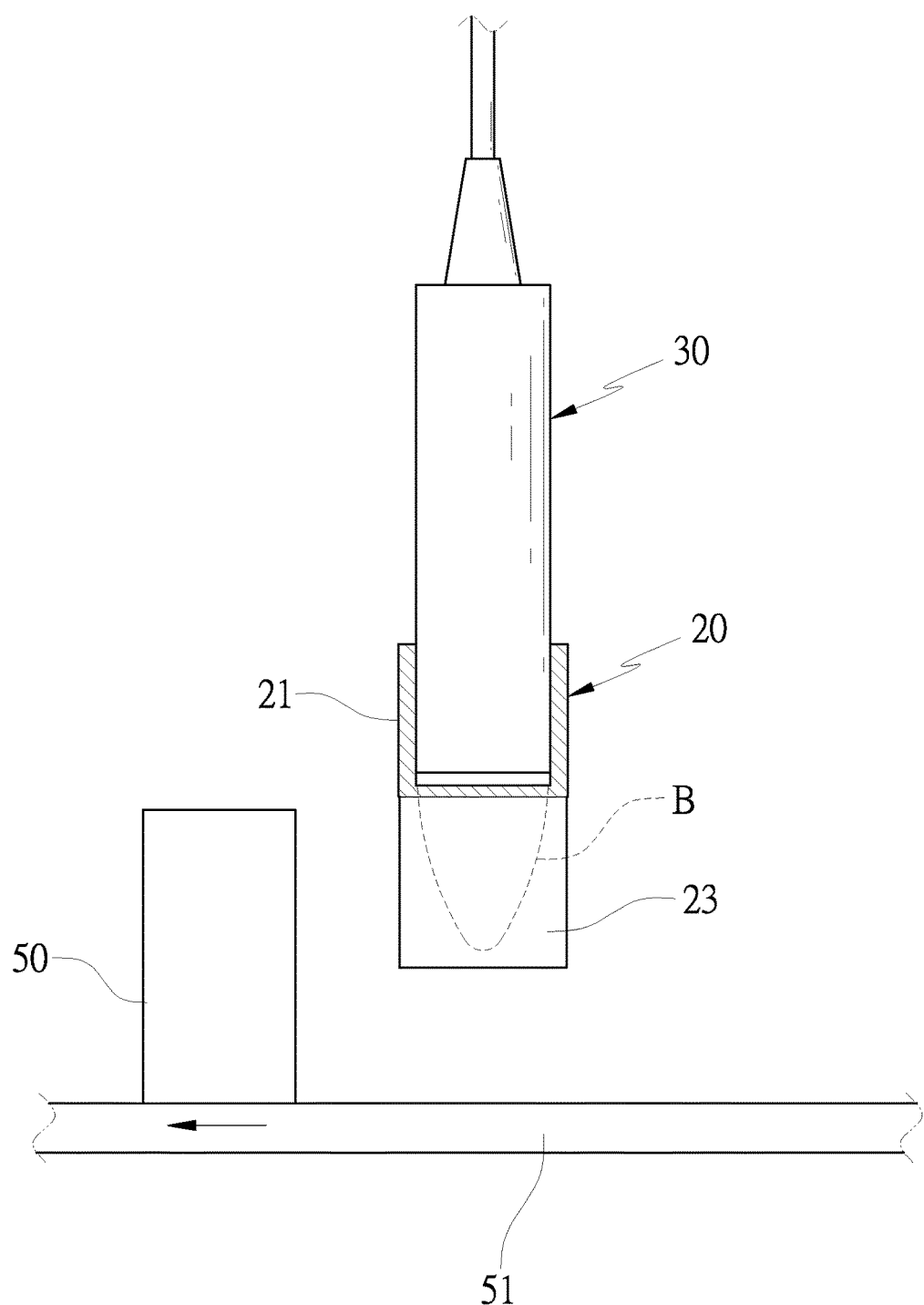

With reference to FIG. 6-1, a difference of a protective sleeve structure for a proximity sensor from that of the first embodiment comprises an inducing element 50 which is linearly moved into the sensing area B of the proximity sensor 30. The inducing element 50 is made of magnetic metal material and is disposed on a platform 51. When the platform 51 does not carry the inducing element 50 to enter into the sensing area B of the proximity sensor 30, electromagnetic effects in the sensing area B are not changed by the inducing element 50, so that the proximity sensor 30 is not triggered. Referring to FIG. 6-2, when the platform 51 moves straightly to carry the inducing element 50 to enter into the sensing area B of the proximity sensor 30 through the passageway 23 of the body 20, the inducing element 50 changes the electromagnetic effects in the sensing area B, and the proximity sensor 30 is triggered to transmit a sensing signal to a controller. Referring to FIG. 6-3, when the platform 51 moves straightly to carry the inducing element 50 to move away from the sensing area B of the proximity sensor 30 via the passageway 23 of the body 20, the electromagnetic effects in the sensing area B recover to stop triggering the proximity sensor 30. Then, the proximity sensor 30 stops transmitting the sensing signal to the controller. Accordingly, the inducing element 50 enters into the sensing area B of the proximity sensor 30 via the passageway 23 of the body 20 to trigger the proximity sensor 30. Preferably, because the outer surface 21 of the body 20 is located at the non-sensing area of the proximity sensor 30, it protects the sensing area B of the proximity sensor 30 and stops the metal substances attaching in the sensing area B of the proximity sensor 30 to avoid triggering the proximity sensor 30 unintentionally.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A protective sleeve for a proximity sensor comprising a body made of non-magnetic material, with the body including:
    a fitting portion arranged on a first end thereof, wherein the fitting portion is a recessed hole which is adapted to matingly fit in an axial direction with a sensing end of the proximity sensor, wherein an outer surface of the body is adapted to be located at a non-sensing area of the proximity sensor; and
    a passageway extending perpendicular to the axial direction and defined on a second end of the body and located at a sensing area of the proximity sensor, with the passageway adapted to allow an inducing element to pass through the passageway such that the sensing end of the proximity sensor is triggered.

2. The protective sleeve for the proximity sensor as claimed in claim 1, wherein the body is injection molded from plastic material or rubber material.

3. The protective sleeve for the proximity sensor as claimed in claim 1, wherein the passageway of the body is formed in a slot shape extending from the second end of the body in the axial direction and adapted to allow the inducing element to pass through.

4. The protective sleeve for the proximity sensor as claimed in claim 3, wherein the fitting portion includes an end wall intermediate the recessed hole and the slot shape extending perpendicular to the axial direction.

5. The protective sleeve for the proximity sensor as claimed in claim 4, wherein the recessed hole has circular cross sections perpendicular to the axial direction.

6. The protective sleeve for the proximity sensor as claimed in claim 5, wherein the slot shape has rectilinear cross sections perpendicular to the axial direction.

* * * * *